United States Patent
Takeda et al.

(10) Patent No.: US 7,282,748 B2
(45) Date of Patent: Oct. 16, 2007

(54) LIGHT EMITTING MODULE AND LAMP

(75) Inventors: Hitoshi Takeda, Shizuoka (JP);
Hisayoshi Daichou, Shizuoka (JP);
Tsukasa Tokida, Shizuoka (JP);
Hiroyuki Ishida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 113 days.

(21) Appl. No.: 11/033,900

(22) Filed: Jan. 13, 2005

(65) Prior Publication Data
US 2005/0156178 A1    Jul. 21, 2005

(30) Foreign Application Priority Data
Jan. 21, 2004    (JP) .............................. 2004-013124

(51) Int. Cl.
*H01L 33/00* (2006.01)
(52) U.S. Cl. .................. 257/98; 257/99; 257/E33.068; 257/E33.073; 362/348; 362/612; 362/309
(58) Field of Classification Search .................. 257/98
See application file for complete search history.

(56) References Cited
U.S. PATENT DOCUMENTS
6,734,465 B1 * 5/2004 Taskar et al. .................. 257/80

6,803,607 B1 * 10/2004 Chan et al. .................... 257/98
2001/0021208 A1 * 9/2001 Ueyanagi ...................... 372/43
2002/0170887 A1 * 11/2002 Furuta et al. ........... 219/121.19
2003/0107894 A1 * 6/2003 Mize ........................... 362/311
2003/0138870 A1 * 7/2003 Tanaka et al. ............. 435/7.93
2004/0208018 A1 * 10/2004 Sayers et al. ............... 362/544
2005/0269578 A1 * 12/2005 Barnes et al. ................. 257/81

FOREIGN PATENT DOCUMENTS

| JP | 2003-086835 | * | 3/2003 |
| JP | 2003-86835 A | | 3/2003 |
| WO | WO 00/70691 A1 | | 11/2000 |

\* cited by examiner

*Primary Examiner*—Tu-Tu V. Ho
(74) *Attorney, Agent, or Firm*—Sughrue Mion, PLLC

(57) ABSTRACT

A light-emitting module having a light-emitting efficiency. The light-emitting module that emits light includes a semiconductor light-emitting element that emits light; and a light transmission member that is provided to cover the semiconductor light-emitting element with materials for transmitting the light emitted from the semiconductor light-emitting element and forms a sub-wavelength grating for reducing reflection of the light on its outgoing face for sending the light incident from an interface facing said semiconductor light-emitting element to its outside in grid periods shorter than a wavelength of the light transmitted by the light transmission member.

12 Claims, 15 Drawing Sheets

FIG. 5
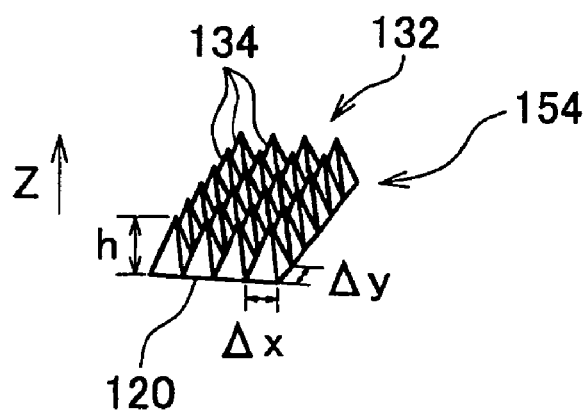
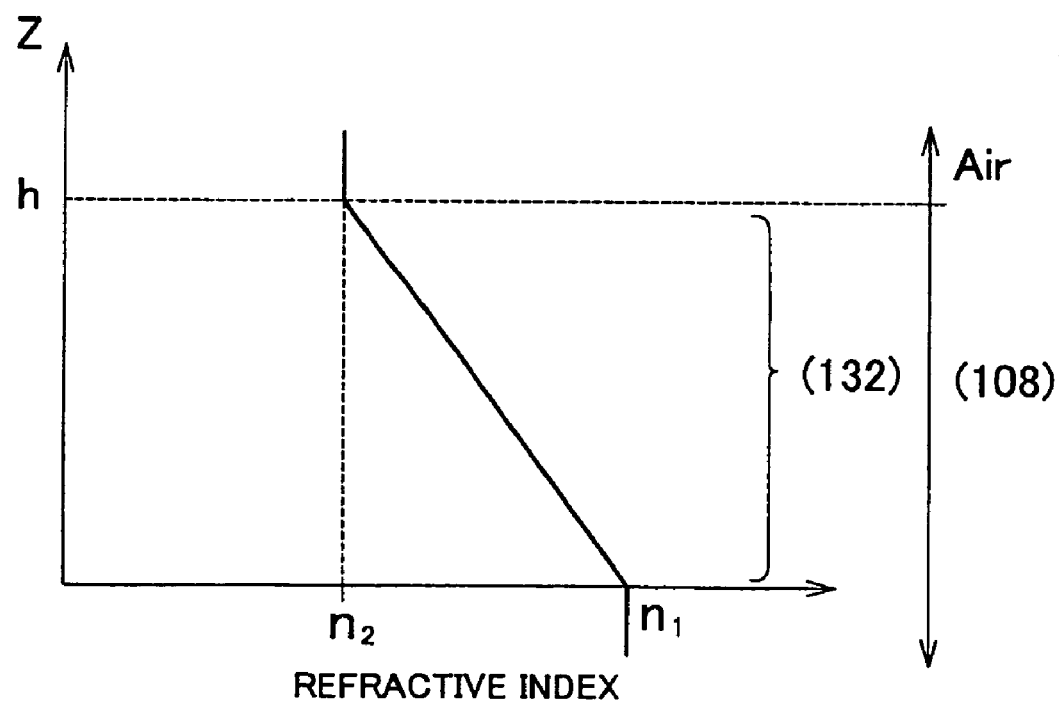
REFRACTIVE INDEX

LIGHT EMITTING MODULE AND LAMP

This patent application claims priority from a Japanese Patent Application No. 2004-013124 filed on Jan. 21, 2004, the contents of which are incorporated herein by reference.

BACKGROUND OF THE INVENTION

1. Field of the Invention

The present invention relates to a light-emitting module and a lamp.

2. Description of Related Art

A light-emitting module such as a light-emitting diode utilizes a semiconductor light-emitting element that emits light. Recently, the configuration capable of improving light-emitting efficiency by providing a plurality of convex portions on the surface of the semiconductor light-emitting element is known as disclosed, for example, in Japanese Patent Laid-Open No. 2003-86835 (pages 1-6, FIGS. 1-13). The plurality of convex portions is arranged in the shape of grid in shorter periods than light wavelength. In addition, the plurality of convex portions is formed by etching the surface of the semiconductor light-emitting element. For this etching, a resist pattern corresponding to the plurality of convex portions is used as an etching mask.

To form a resist pattern having shorter periods than light wavelength, it is necessary to write the pattern on a resist film, e.g., by an electron beam lithography method. However, in an exposure process performed by the electron beam lithography method, it is difficult to write a large quantity of patterns at a time in some cases. Therefore, a high cost was conventionally required in some cases when desiring to produce a semiconductor light-emitting element having high light-emitting efficiency.

SUMMARY OF THE INVENTION

Therefore, it is an object of the present invention to provide a light-emitting module and a lamp that can solve the foregoing problems. The above and other objects can be achieved by combinations described in the independent claims. The dependent claims define further advantageous and exemplary combinations of the present invention.

According to the first aspect of the present invention, there is provided a light-emitting module that emits light. The light-emitting module includes: a semiconductor light-emitting element that emits light; and a light transmission member that is provided to cover the semiconductor light-emitting element with materials for transmitting the light emitted from the semiconductor light-emitting element and forms a sub-wavelength grating for reducing reflection of the light on its outgoing face for sending the light incident from an interface facing the semiconductor light-emitting element to its outside in grid periods shorter than a wavelength of the light transmitted by the light transmission member.

In the light-emitting module, the light transmission member may be formed of resin.

In the light-emitting module, the light transmission member may be a sealing member for sealing the semiconductor light-emitting element.

The light-emitting module may further include a sealing member that seals the semiconductor light-emitting element with materials for transmitting the light emitted from the semiconductor light-emitting element, in which the light transmission member may be a lens that is provided on the sealing member so as to face the semiconductor light-emitting element while putting the sealing member therebetween.

In the light-emitting module, the lens may be formed separately from the sealing member, and at least the sub-wavelength grating of the lens may be formed by injection molding.

In the light-emitting module, the sub-wavelength grating may be formed by a die-forming for the outgoing face of the light transmission member.

In the light-emitting module, the sub-wavelength grating may have a plurality of convex portions protruding in a direction perpendicular to the outgoing face, the plurality of convex portions may be arranged at grating intervals shorter than half-wavelength of the light to be transmitted through the light transmission member, and a height of the convex portion may be higher than half-wavelength of the light to be transmitted through the light transmission member.

In the light-emitting module, the semiconductor light-emitting element may emit ultraviolet rays, the light-emitting module may further include a phosphor layer for generating red light, green light, and blue light in accordance with the ultraviolet rays emitted from the semiconductor light-emitting element, the light transmission member may transmit red light, green light, and blue light generated from the phosphor layer to send the light from the outgoing face to an air medium, the plurality of convex portions may be arranged at grating intervals shorter than half-wavelength of the blue light transmitting the light transmission member, and a height of the convex portion may be higher than half-wavelength of the red light transmitting an air medium.

In the light-emitting module, the semiconductor light-emitting element may emit blue light, the light-emitting module may further include a phosphor layer for generating yellow light in accordance with the blue light emitted from the semiconductor light-emitting element, the light transmission member may transmit blue light and yellow light generated from the semiconductor light-emitting element and the phosphor layer to send the light from the outgoing face to an air medium, the plurality of convex portions may be arranged at grating intervals shorter than half-wavelength of the blue light transmitting the light transmission member, and a height of the convex portion may be higher than half-wavelength of the yellow light transmitting an air medium.

In the light-emitting module, the semiconductor light-emitting element may emit light from a light-emitting face facing the outgoing face, and the outgoing face of the light transmission member may be parallel to the light-emitting face of the semiconductor light-emitting element.

In the light-emitting module, a refractive index of the light transmission member may be larger than that of the outside of the light transmission member on the outgoing face and smaller than that of the outside of the light transmission member on the interface facing the semiconductor light-emitting element, and a refractive index difference between the inside and the outside of the light transmission member on the outgoing face may be larger than that between the inside and the outside of the light transmission member on the interface facing the semiconductor light-emitting element.

In the light-emitting module, a refractive index of the light transmission member may be larger than that of either the outside of the light transmission member on the outgoing face or the outside of the light transmission member on the interface facing the semiconductor light-emitting element.

In the light-emitting module, the semiconductor light-emitting element may emit light from a light-emitting face facing the outgoing face and an end face perpendicular to the light-emitting face, the light transmission member maybe formed to cover the light-emitting face and the end face of the semiconductor light-emitting element, and the light transmission member may reflect light emitted from the end face by the semiconductor light-emitting element toward the outgoing face of the light transmission member using a side face facing the end face of the semiconductor light-emitting element.

In the light-emitting module, the semiconductor light-emitting element may emit light from a light-emitting face facing the outgoing face, a rear face of the light-emitting face, and/or an end face perpendicular to the light-emitting face, and the light-emitting module may further include a reflecting section for reflecting light emitted from the rear face and the end face by the semiconductor light-emitting element toward the outgoing face of the light transmission member.

According to the second aspect of the present invention, there is provided a lamp that emits light. The lamp includes: a light-emitting module operable to emit light; and an optical member operable to irradiate light emitted from the light-emitting module to the outside of the lamp, in which the light-emitting module includes: a semiconductor light-emitting element that emits light; and a light transmission member that is provided to cover the semiconductor light-emitting element with materials for transmitting the light emitted from the semiconductor light-emitting element and forms a sub-wavelength grating for reducing reflection of the light on its outgoing face for sending the light incident from an interface facing the semiconductor light-emitting element to its outside in grid periods shorter than a wavelength of the light transmitted by the light transmission member, and the optical member has optical center on the semiconductor light-emitting element.

In the lamp, the lamp may be a lamp used for a headlight of a vehicle, the semiconductor light-emitting element may emit light from a light-emitting face facing the outgoing face of the light transmission member, the outgoing face of the light transmission member may be parallel to the light-emitting face of the semiconductor light-emitting element, and the optical member may form at least a part of cut line that defines borders between bright and dark sides of a light distribution pattern of the headlight by projecting a shape of the light-emitting face of the semiconductor light-emitting element.

The summary of the invention does not necessarily describe all necessary features of the present invention. The present invention may also be a sub-combination of the features described above.

BRIEF DESCRIPTION OF THE DRAWINGS

The above and other objects and features and advantages of the present invention will become more apparent from the following description of the presently preferred exemplary embodiments of the invention taken in conjunction with the accompanying drawings, in which:

FIG. 5 is a view exemplary explaining a function of a sub-wavelength gratingl;

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
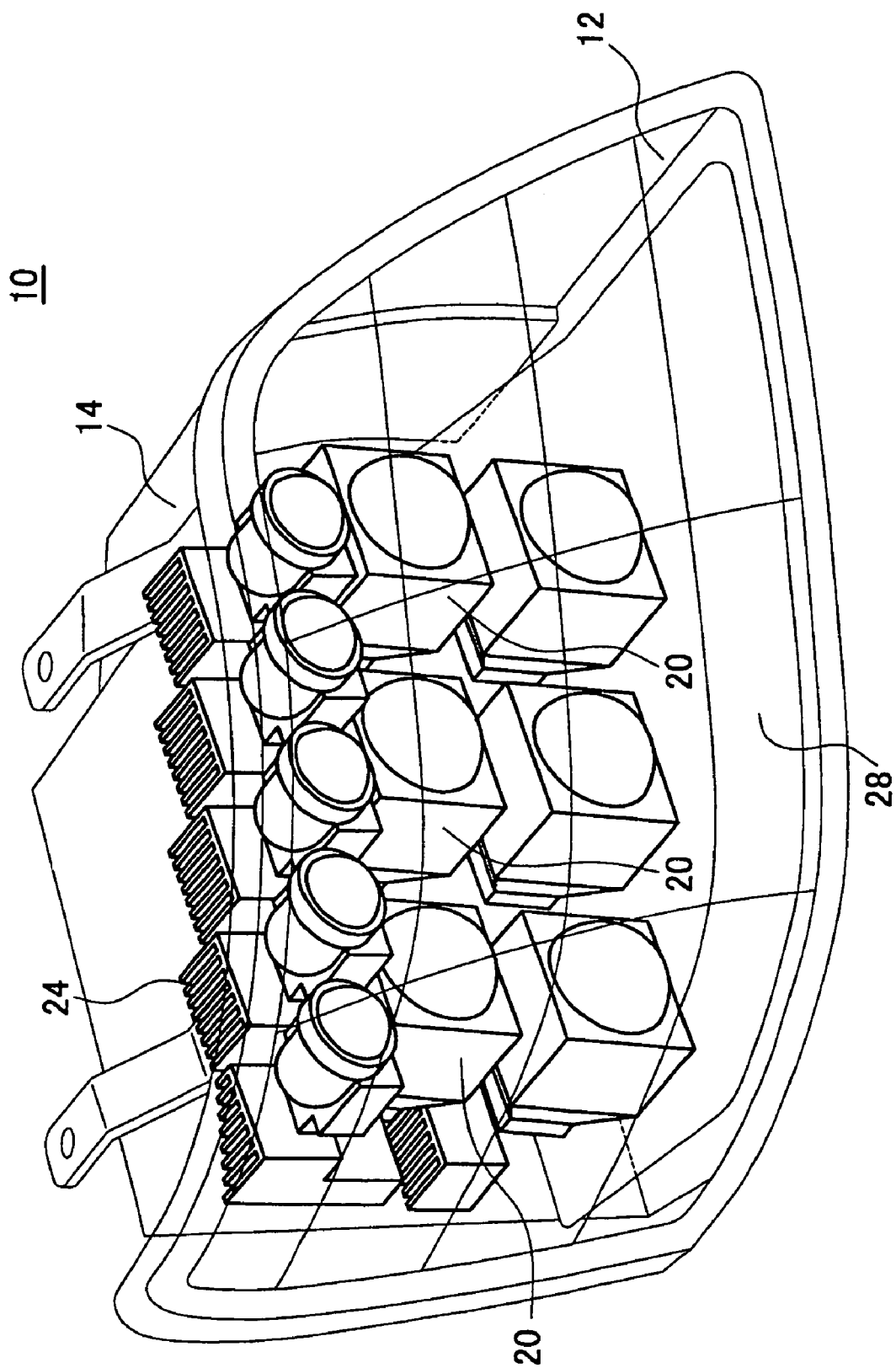
FIG. 1 is a perspective view showing a configuration of a vehicular lamp according to an embodiment of the present invention.
Figure 2:
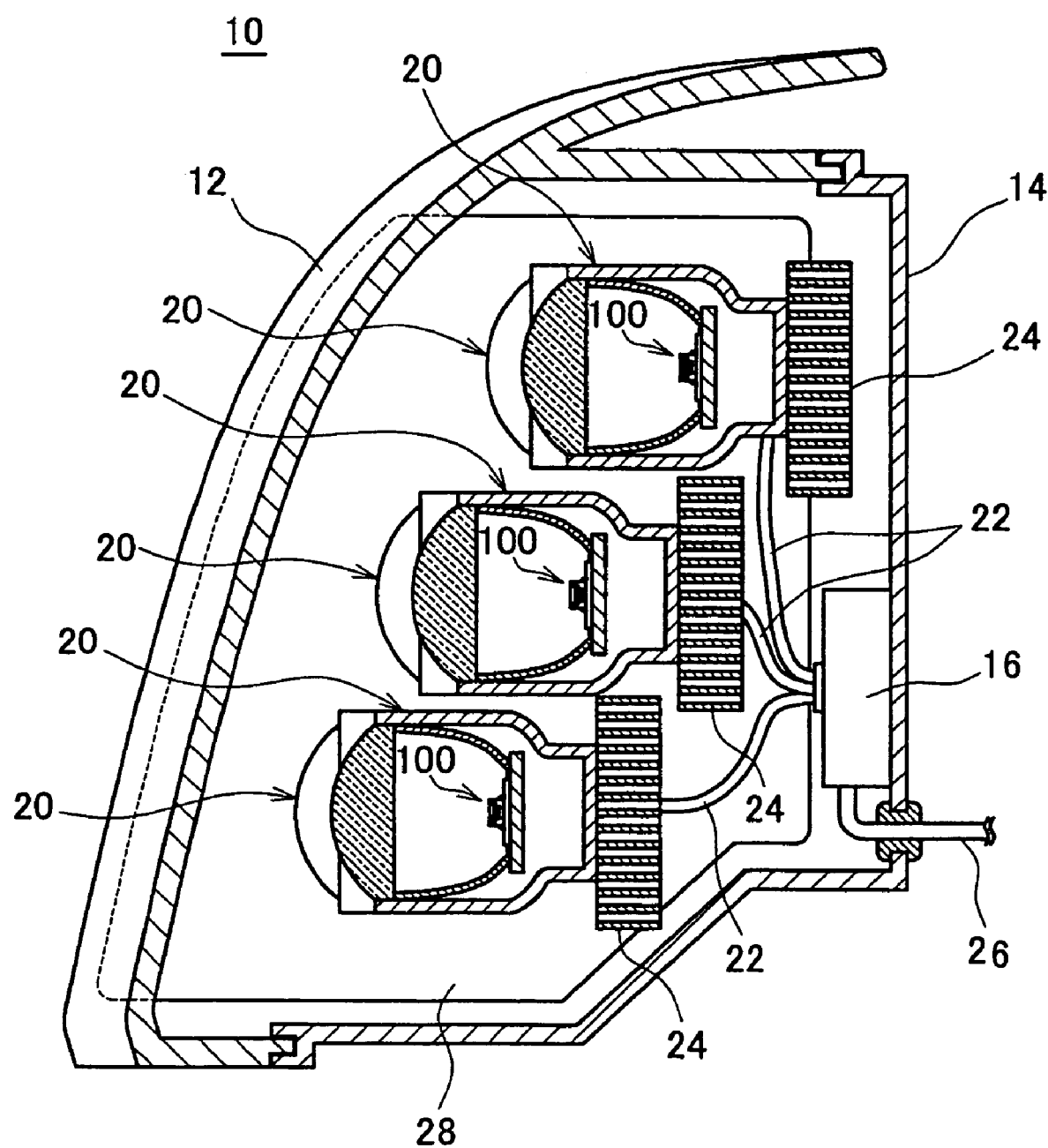
FIG. 2 is a horizontal sectional view of the vehicular lamp.

FIGS. 1 and 2 are views exemplary showing a configuration of a vehicular lamp 10 according to an embodiment of the present invention. FIG. 1 is a perspective view of the vehicular lamp 10. FIG. 2 is a horizontal sectional view of the vehicular lamp 10 by a horizontal plane crossing a light source unit 20 in the middle stage. The object of the present example is to provide an LED module 100 at low cost, which is adapted to form a light distribution pattern with high precision. The vehicular lamp 10 is, e.g., a headlight (a head lamp) used for a vehicle such as an automobile, and irradiates light ahead of the vehicle. The vehicular lamp 10 includes a plurality of light source units 20, a cover 12, a lamp body 14, a circuit unit 16, a plurality of heat dissipation members 24, an extension reflector 28, and cables 22 and 26.

Each of the plurality of light source units 20 has an LED module 100, and irradiates a predetermined light distribution pattern ahead of the vehicle based on light emitted from the LED module 100. The light source units 20 are supported by the lamp body 14, e.g., so as to be able to be tilted by an aiming mechanism for adjusting a direction of optical axis of the light source units 20. The light source units 20 may be supported by the lamp body 14 so that a direction of optical axis when the vehicular lamp 10 is mounted on a car body takes a downturn, e.g., by 0.3-0.6°.

In addition, the plurality of light source units 20 may have the same or similar light distribution characteristics as/to each other, and may have light distribution characteristics different from each other. In addition, in another example, one light source unit 20 may have the plurality of LED modules 100. The light source unit 20 may have, for example, a semiconductor laser in place of the LED module 100.

The cover 12 and the lamp body 14 form a light room of the vehicular lamp 10, and the light room accommodates the plurality of light source units 20 therein. The cover 12 and the lamp body 14 may seal and waterproof the light source units 20. The cover 12 is formed of materials for transmitting light emitted from the LED modules 100, e.g., in the shape of transparent glasses, and is provided in the front of the vehicle so as to cover the front of the plurality of light source units 20. The lamp body 14 is provided opposite to the cover 12 to put the plurality of light source units 20 therebetween, and thus the plurality of light source units 20 is covered from the rear. The lamp body 14 may integrally be formed with a vehicle body.

The circuit unit 16 is a module on which a lighting circuit such as a circuit for lighting the LED modules 100 is formed. The circuit unit 16 is electrically connected to the light source units 20 via the cable 22. In addition, the circuit unit 16 is electrically connected to the outside of the vehicular lamp 10 via the cable 26.

Each of the plurality of heat dissipation members 24 is a heat sink that is provided in contact with at least a part of the light source unit 20. The heat dissipation member 24 is formed of materials such as metal having higher thermal conductivity than that of air. The heat dissipation members 24 are movable with the light source units 20 in the range of moving the light source units 20 with respect to, e.g., a supporting point of an aiming mechanism. Additionally, the heat dissipation members 24 are provided at intervals sufficient to perform adjustment of the optical axes of the light source units 20 with respect to the lamp body 14. The plurality of heat dissipation members 24 may integrally be formed of one metallic member. In this case, heat dissipation can efficiently be done from the whole of the plurality of heat dissipation members 24.

The extension reflector 28 is a reflecting mirror that is formed of, e.g., thin metal plate from the lower part of the plurality of light source units 20 to the cover 12. The extension reflector 28 is formed to cover at least a part of the inside of the lamp body 14. Therefore, the extension reflector 28 hides the inside of the lamp body 14, thereby improving the appearance of the vehicular lamp 10.

In addition, at least a part of the extension reflector 28 is in contact with the light source unit 20 and/or the heat dissipation member 24. In this case, the extension reflector 28 acts as a thermal conduction member that conducts heat generated from the LED modules 100 to the cover 12. In this way, the extension reflector 28 radiates heat of the LED modules 100. Additionally, a part of the extension reflector 28 is fixed to the cover 12 or the lamp body 14. The extension reflector 28 may be formed in the shape of the frame in which the extension reflector 28 covers the upper part, the lower part, and the lateral part of the plurality of light source units 20.

According to this example, it is possible to miniaturize the light source unit 20 by using the LED module 100 as light source. In this way, freedom degree of arrangement of, e.g., the light source units 20 is improved. Thus, it is possible to provide the vehicular lamp 10 having a variety of design.

Figure 3:
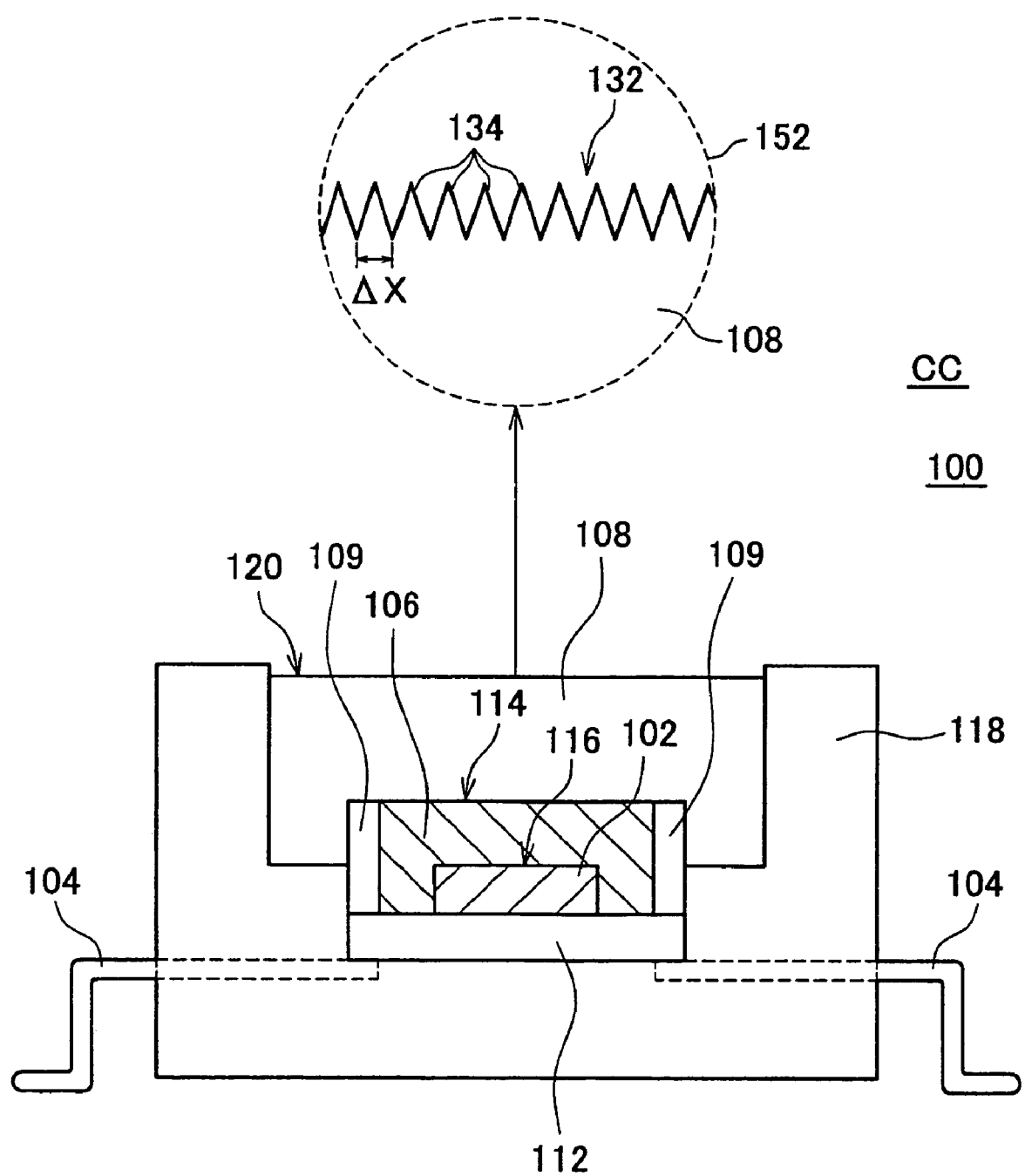
FIG. 3 is a sectional view taken on line C-C of an LED module.
Figure 4:
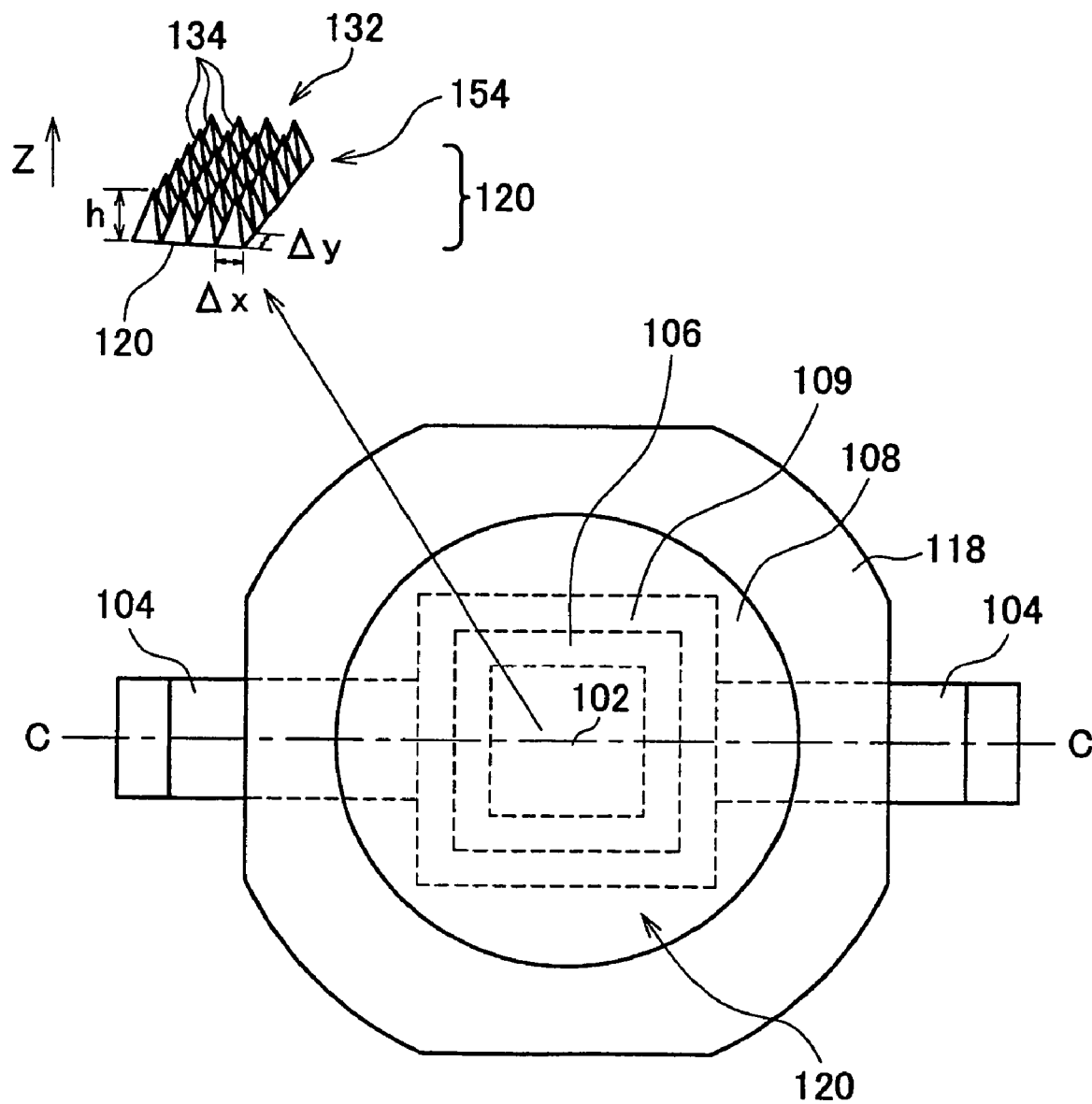
FIG. 4 is a top view of the LED module.

FIGS. 3 and 4 show an example of a configuration of the LED module 100. FIG. 3 is a sectional view taken on line C-C of the LED module 100. FIG. 4 is a top view of the LED module 100. The LED module 100 is an example of a light-emitting module for emitting light, and includes a substrate 112, a plurality of electrodes 104, a cavity 109, a holding section 118, a sealing member 108, a light-emitting diode element 102, and a phosphor layer 106.

The substrate 112 is a plate-like body that puts the light-emitting diode element 102 on its top face to fix it. In addition, the substrate 112 includes electric wiring for electrically connecting the light-emitting diode element 102 to the electrodes 104 in order to supply electric power received from the plurality of electrodes 104 to the light-emitting diode element 102. The plurality of electrodes 104 supplies electric power received from the outside of the LED module 100 to the light-emitting diode element 102 via the substrate 112. The cavity 109 is a void that is formed to surround the light-emitting diode element 102 on the substrate 112, and holds the phosphor layer 106 therein.

The holding section 118 holds the plurality of electrodes 104, the substrate 112, the cavity 109, and the sealing member 108. In addition, at least a part of the holding section 118 is formed of materials such as metal having higher thermal conductivity than that of air, and thus transmits heat generated from the light-emitting diode element 102 to the outside of the LED module 100 via, e.g., the substrate 112.

The light-emitting diode element 102 is an example of a semiconductor light-emitting element for emitting light, and emits ultraviolet rays in accordance with electric power received from the outside of the LED module 100 via the electrode 104 and the substrate 112. In this example, the light-emitting diode element 102 emits light by using the substantially whole part of a light-emitting face 116 that is a surface facing the sealing member 108 as an emitting region. In this example, the light-emitting face 116 is a rectangle surrounded by straight line-shaped four sides.

In addition, the light-emitting diode element 102 includes, e.g., a sapphire substrate and a semiconductor layer formed on the sapphire substrate. In this case, the sapphire substrate has a refractive index of about 1.8 (for example, 1.75 to 1.85). In addition, this semiconductor layer is formed of, e.g., InGaN, and has a refractive index of, e.g., about 2.2 to 2.5. The semiconductor layer may have a refractive index of, e.g., about 2 to 4.

In this example, the light-emitting diode element 102 is flip-chip mounted on the substrate 112 so that the sapphire substrate is positioned to face the sealing member 108, and emits light by using the surface of the sapphire substrate as the light-emitting face 116. In this case, a refractive index of the light-emitting diode element 102 in the light-emitting face 116 is about 1.8 (1.75 to 1.85). In another example, the light-emitting diode element 102 may be mounted so that the surface of the semiconductor layer is positioned to face the sealing member 108. In this case, the light-emitting diode element 102 emits light by using the surface of the semiconductor layer as the light-emitting face 116. In addition, in this case, a refractive index of the light-emitting diode element 102 in the light-emitting face 116 is, e.g., about 2.2 to 2.5.

Additionally, the light-emitting diode element 102 may emit, e.g., blue light in place of ultraviolet rays. In another example, the LED module 100 may have, e.g., a laser diode element as the semiconductor light-emitting element.

The phosphor layer 106 is provided to cover the surface of the light-emitting diode element 102 by being filled in the cavity 109, and emits red light, green light, and blue light in accordance with ultraviolet rays emitted from the light-emitting diode element 102. In this way, the phosphor layer 106 emits white light in accordance with ultraviolet rays. In addition, the LED module 100 thereby emits white light.

Here, the phosphor layer 106 has, e.g., a binder and phosphor particles. The binder is a laminated body that is formed of resin having a high tolerance for ultraviolet rays such as silicone/fluorine/imide resin, silicone resin, or epoxy resin, and holds the phosphor particles therein. In addition, the phosphor particles are fluorescent particles that emit light in accordance with incident light. In this example, the phosphor layer 106 has plural types of phosphor particles. Each type of the phosphor particles emits each of red light, green light, and blue light in accordance with ultraviolet rays.

In addition, when the light-emitting diode element 102 emits blue light, the phosphor layer 106 may emit light of yellow that is complementary color of blue in accordance with blue light emitted from the light-emitting diode element 102. In this case, the LED module 100 emits white light based on blue light and yellow light emitted from the light-emitting diode element 102 and the phosphor layer 106. The phosphor layer 106 may be provided in the inside of the sealing member 108.

The sealing member 108 is an example of a light transmission member. The sealing member 108 is a mold for sealing the light-emitting diode element 102, and is provided to cover the light-emitting diode element 102 with resin that transmits light emitted from the light-emitting diode element 102. In this example, the sealing member 108 is formed of materials that transmit white light, and seals the light-emitting diode element 102 and the phosphor layer 106. In this case, the sealing member 108 is positioned to face the light-emitting diode element 102 so as to put the phosphor layer 106 therebetween. In addition, this white light is an example of light emitted from the LED module 100. The sealing member 108 may be formed of, e.g., silicone/fluorine/imide resin, silicone resin, or epoxy resin.

In addition, in this example, the sealing member 108 has an outgoing face 120, and is in contact with air at the outgoing face 120. The outgoing face 120 is parallel to the light-emitting face 116 of the light-emitting diode element 102, and emits light incident from an interface 114 facing the light-emitting diode element 102 to the outside. In this way, the sealing member 108 transmits red light, green light, and blue light generated from the phosphor layer 106 in order to emit light from the outgoing face 120 to an air medium. In addition, when the light-emitting diode element 102 emits blue light and the phosphor layer 106 emits yellow light, the sealing member 108 transmits blue light and yellow light emitted from the light-emitting diode element 102 and the phosphor layer 106 in order to emit light from the outgoing face 120 to an air medium.

A sub-wavelength grating 132 as shown in an enlarged view 152 and an enlarged view 154 is formed on the outgoing face 120. In this example, the sub-wavelength grating 132 has a plurality of convex portions 134 that protrudes in the direction perpendicular to the outgoing face 120. In addition, the enlarged view 152 shows the sub-wavelength grating 132 taken on line A-A. The enlarged view 154 shows the sub-wavelength grating 132 seen from obliquely upward direction.

The sub-wavelength grating 132 is formed on the outgoing face 120 with shorter grid period than a wavelength of light transmitted by the sealing member 108. In this case, diffracted waves are not generated, and thus the sub-wavelength grating 132 is equivalent to a medium having a middle effective refractive index between the sealing member 108 and an air medium with respect to light that is incident from the inside of the sealing member 108 to the outgoing face 120.

Here, the sealing member 108 has larger refractive index than that of air of, e.g., about 1.3 to 1.6 in order to improve light-emitting efficiency from the light-emitting diode element 102. In this case, a refractive index of the sealing member 108 is larger than that of the outside of the sealing member 108 on the outgoing face 120. For that purpose, when it is attempted to send light from the inside of the sealing member 108 to an air medium, e.g., without the sub-wavelength grating 132, total reflection can occur on the outgoing face 120 due to the discontinuous change of a refractive index in some cases. In this case, it is impossible to efficiently send light from the sealing member 108 to an air medium. However, in this example, since the sub-wavelength grating 132 has a middle effective refractive index between the sealing member 108 and an air medium, reflection of light on the outgoing face 120 is reduced. For that purpose, according to the present example, it is possible to efficiently send light from the sealing member 108 to an air medium. Furthermore, in this way, it is possible to provide the LED module 100 having high light-emitting efficiency.

Here, in this example, the interface 114 is positioned to face the light-emitting diode element 102 to put the phosphor layer 106 therebetween. Therefore, the sealing member 108 is in contact with the phosphor layer 106 on the interface 114. In this case, preferably, a refractive index of the phosphor layer 106 is smaller than that of the light-emitting diode element 102 on the light-emitting face 116, and is larger than that of the sealing member 108 on the interface 114. In addition, a refractive index of the phosphor layer 106 is, e.g., a refractive index on an interface of the phosphor layer 106. Since a refractive index on the interface of the phosphor layer 106 is less affected by a refractive index of phosphor particles therein, a refractive index on the interface of the phosphor layer 106 is substantially identical with a refractive index of a binder of the phosphor layer 106, and it is, e.g., about 1.3 to 1.6.

In addition, a refractive index of the sealing member 108 may be larger than that of air and may be smaller than that of the phosphor layer 106. In this case, a refractive index of the sealing member 108 may be smaller than that of the binder of the phosphor layer 106. A refractive index of the sealing member 108 may be smaller than that of the outside of the sealing member 108 on the interface 114.

In this way, in this example, since a refractive index of the optical path from the light-emitting diode element 102 to an air medium becomes small by degrees due to the phosphor layer 106 and the sealing member 108 therebetween, a sudden change of a refractive index does not occur. For that purpose, according to the present example, it is possible that light is efficiently incident from the light-emitting diode element 102 to the phosphor layer 106 and also is efficiently incident from the phosphor layer 106 to the sealing member 108.

In addition, in this example, it is possible to efficiently draw light from the sealing member 108 to an air medium through the outgoing face 120 using the function of the sub-wavelength grating 132. Therefore, a difference of a refractive index between the inside and the outside of the sealing member 108 on the outgoing face 120 may be larger than that between the inside and the outside of the sealing member 108 on the interface 114 facing the light-emitting diode element 102. In this case, light can efficiently be incident from the interface 114 to the sealing member 108, and the incident light can efficiently be sent from the outgoing face 120 to an air medium.

In addition, in an other example, a refractive index of sealing member 108 may be larger than that of either air or the phosphor layer 106. In this case, a refractive index of the sealing member 108 becomes larger than that of any of the outside of the sealing member 108 on the outgoing face 120 and the outside of the sealing member 108 on the interface 114. In this way, it is possible to prevent total reflection from occurring on the interface 114 and further to cause light to be efficiently incident from the phosphor layer 106 to the sealing member 108. Therefore, in this case, the sealing member 108 can efficiently transmit light from the light-emitting diode element 102 to an air medium.

Although the sub-wavelength grating 132 is not used, it is possible to reduce reflection by the outgoing face 120 by forming the outgoing face 120 as the shape of a spherical surface. However, in this case, the sealing member 108 acts as a convex lens. Therefore, an optical design of the light source unit 20 (see FIG. 1) should consider the function of the convex lens. In this case, for example, the optical design can be complicated in some cases. In addition, if it is attempted to form the convex lens with high precision in order to form a light distribution pattern with high precision, the cost of the LED module 100 can greatly rise in some cases.

However, in this example, the outgoing face 120 is formed in the shape of a plane that is parallel to the light-emitting face 116 of the light-emitting diode element 102. For that purpose, according to the present example, it is possible to simply realize an optical design of the light source unit 20 without considering the lens function of the sealing member 108. In addition, the outgoing face 120 having a planar shape can cheaply be formed with high accuracy. Therefore, according to the present example, the LED module 100 can be offered at low cost.

FIG. 5 is a view exemplary explaining a function of the sub-wavelength grating 132. In this example, a refractive index of the sealing member 108 is $n_1$. In addition, a refractive index of air is $n_2$. Furthermore, each of the convex portions 134 in the sub-wavelength grating 132 has the shape of a quadrangular pyramid and a cross-section area that is gradually reduced in the direction of height (z-axis) perpendicular to the outgoing face 120.

Here, an effective refractive index of the sub-wavelength grating 132 is varied in accordance with volume occupancy rate of a medium of the sealing member 108 and air. For that purpose, in this example, an effective refractive index of the sub-wavelength grating 132 is gradually varied from the refractive index $n_1$ of the sealing member 108 to the refractive index $n_2$ of air in accordance with a distance h from a bottom face of the convex portion 134. In this way, a difference between a refractive index of the inside and a refractive index of the outside of the sealing member 108 on the outgoing face 120 can smoothly be matched. Therefore, according to the present example, reflection from the outgoing face 120 can be reduced.

Here, it is preferable that the plurality of convex portions 134 is arranged at grating intervals Δx, Δy shorter than half-wavelength of light to be transmitted through the sealing member 108. For example, the plurality of convex portions 134 may be arranged at grating intervals Δx, Δy shorter than half-wavelength of blue light within the sealing member 108. In addition, it is preferable that the height h of the convex portion 134 is longer than half-wavelength of light to be transmitted through the sealing member 108. For example, the height h of the convex portion 134 may be longer than half-wavelength of red light within an air medium. In this case, reflection from the outgoing face 120 can further be reduced adequately.

In addition, when the light-emitting diode element 102 emits blue light and the phosphor layer 106 emits yellow light, the plurality of convex portions 134 may be arranged at grating intervals Δx, Δy shorter than half-wavelength of blue light within the sealing member 108 and the height h of the convex portion 134 may be longer than half-wavelength of yellow light within an air medium. In addition, in another example, the convex portion 134 may be, e.g., a conical shape or a pyramidal shape having many angles. It is preferable that the convex portions 134 are formed in a tapered shape of which a cross-section area is gradually reduced in the direction of height. In addition, it is preferable that an aspect ratio of the convex portion 134 is one or more.

Figure 6:
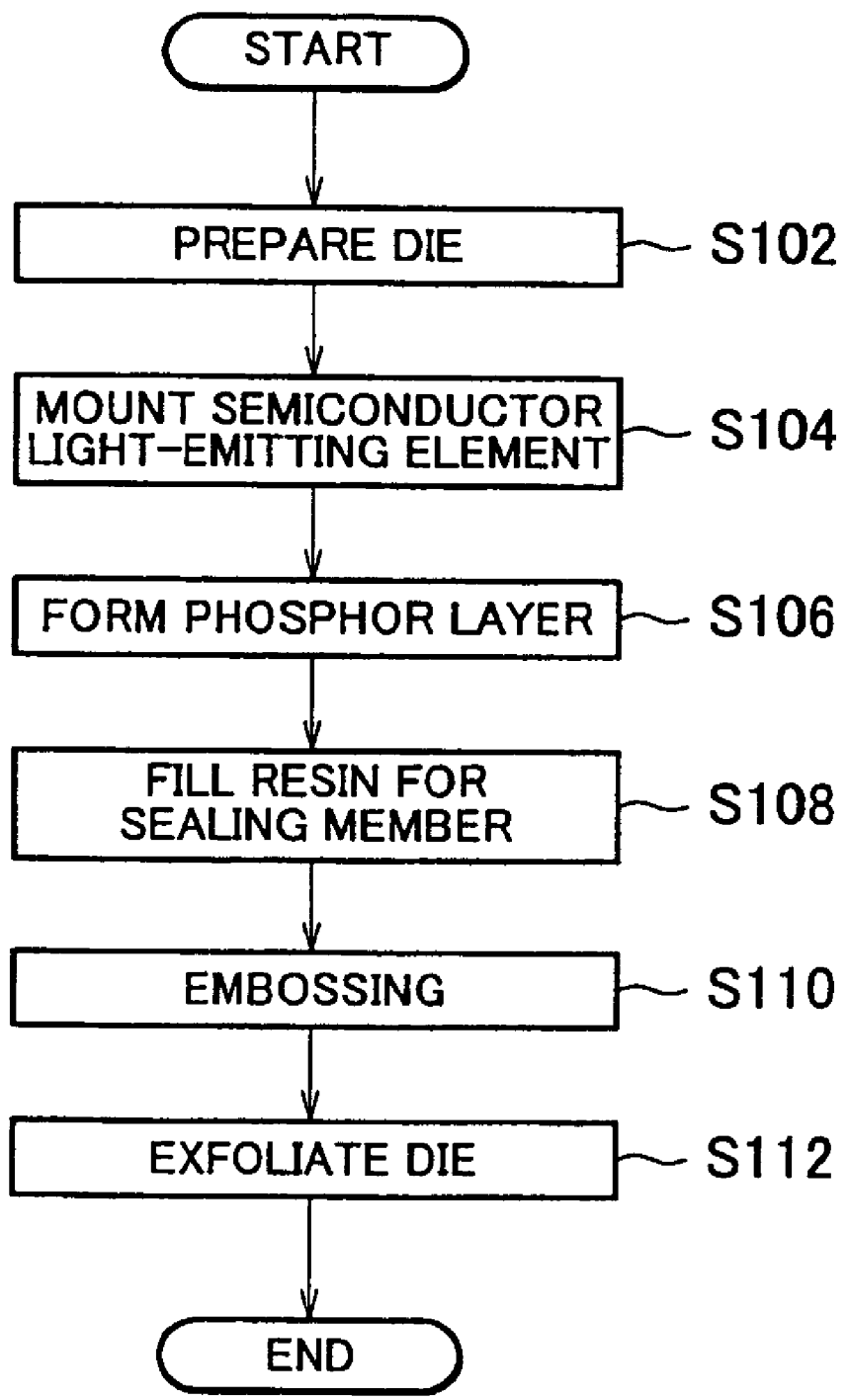
FIG. 6 is a flowchart exemplary showing a method for manufacturing the LED module.

FIG. 6 is a flowchart exemplary showing a method for manufacturing the LED module 100. In this example, the sub-wavelength grating 132 is formed by a die-forming for the outgoing face 120 of the sealing member 108. It is preferable that the die-forming is a nanoimprint having processing accuracy less than or equal to 100 nm.

In this manufacturing method, a die for the die-forming is firstly prepared (S102). For example, the die is formed by processing a silicon substrate or the like by an electron-beam lithography method. Next, the light-emitting diode element 102 is mounted on, e.g., the substrate 112 held in the holding section 118 (S104), and the phosphor layer 106 is formed by filling the phosphor particles and the binder in the cavity 109 (S106).

Then, resin for the sealing member 108 is filled to cover the light-emitting diode element 102 and the phosphor layer 106 (S108), and an embossing is performed with respect to the outgoing face 120 using the die prepared at the step S102 (S110). In this case, for example, the resin for the sealing member 108 is softened by heating, and the embossing is performed. Then, the manufacturing method of this example exfoliates the die (S112), and terminates the flowchart.

Here, since an etching mask should be formed for each sealing member 108 when forming the sub-wavelength grating 132 as the etching mask, a lot of masks must be formed by, e.g., an electron beam lithography method. However, according to this example, it is possible to repeatedly perform the die-forming with respect to a lot of sealing members 108 using one die. Therefore, according to this example, it is possible to simply form the sub-wavelength grating 132 on the sealing member 108 at low cost. In this way, it is possible to provide the LED module 100 having high light-emitting efficiency at low cost.

In addition, the resin for the sealing member 108 may be, e.g., ultraviolet curing resin. In this case, the embossing may be performed at the step S110 before the resin is cured by irradiating ultraviolet rays. The resin in the sealing member 108 may also be cured by, e.g., ultraviolet rays emitted from the light-emitting diode element 102 after performing the embossing.

Figure 7:
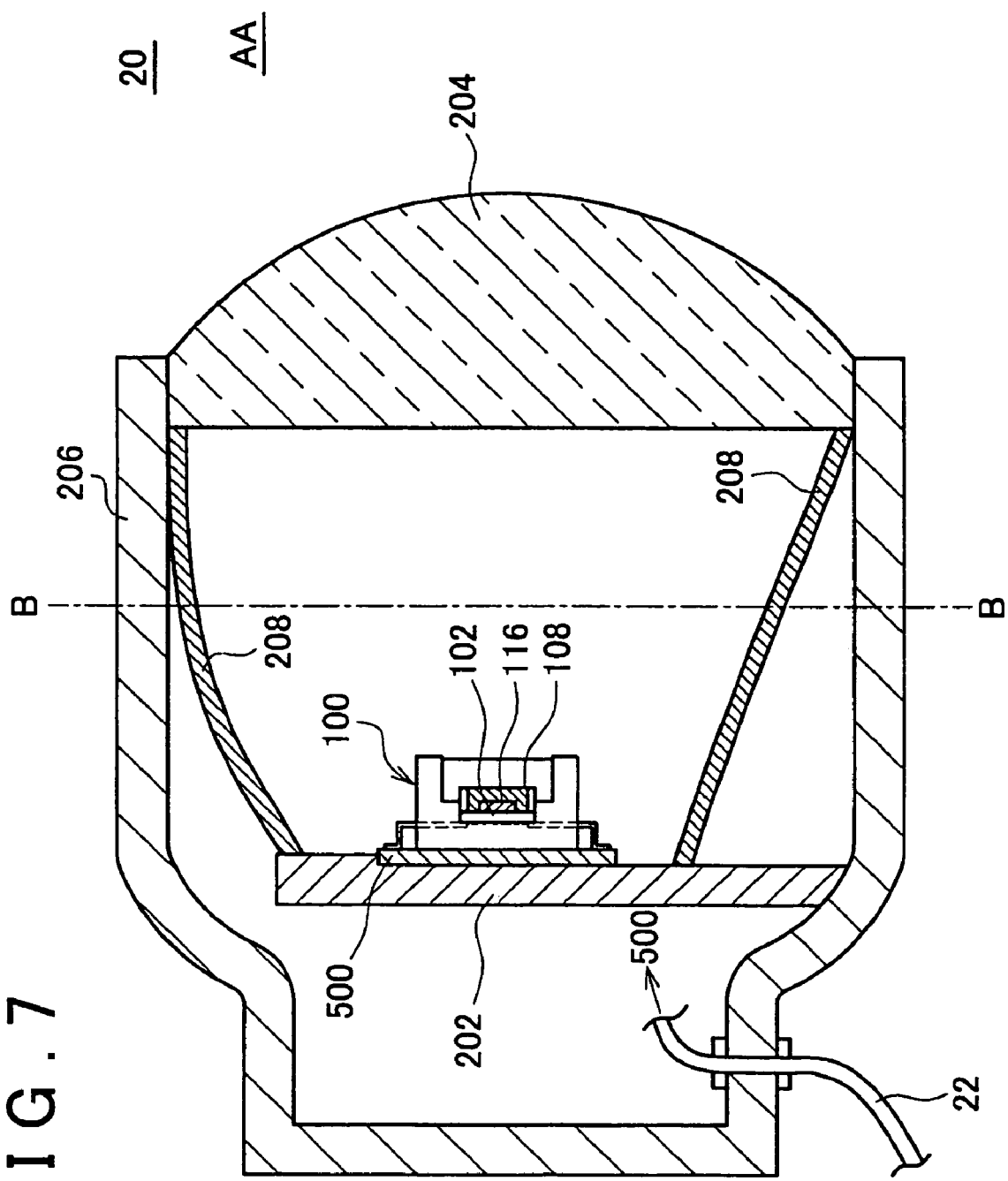
FIG. 7 is a vertical sectional view taken on line A-A of a light source unit.
Figure 8:
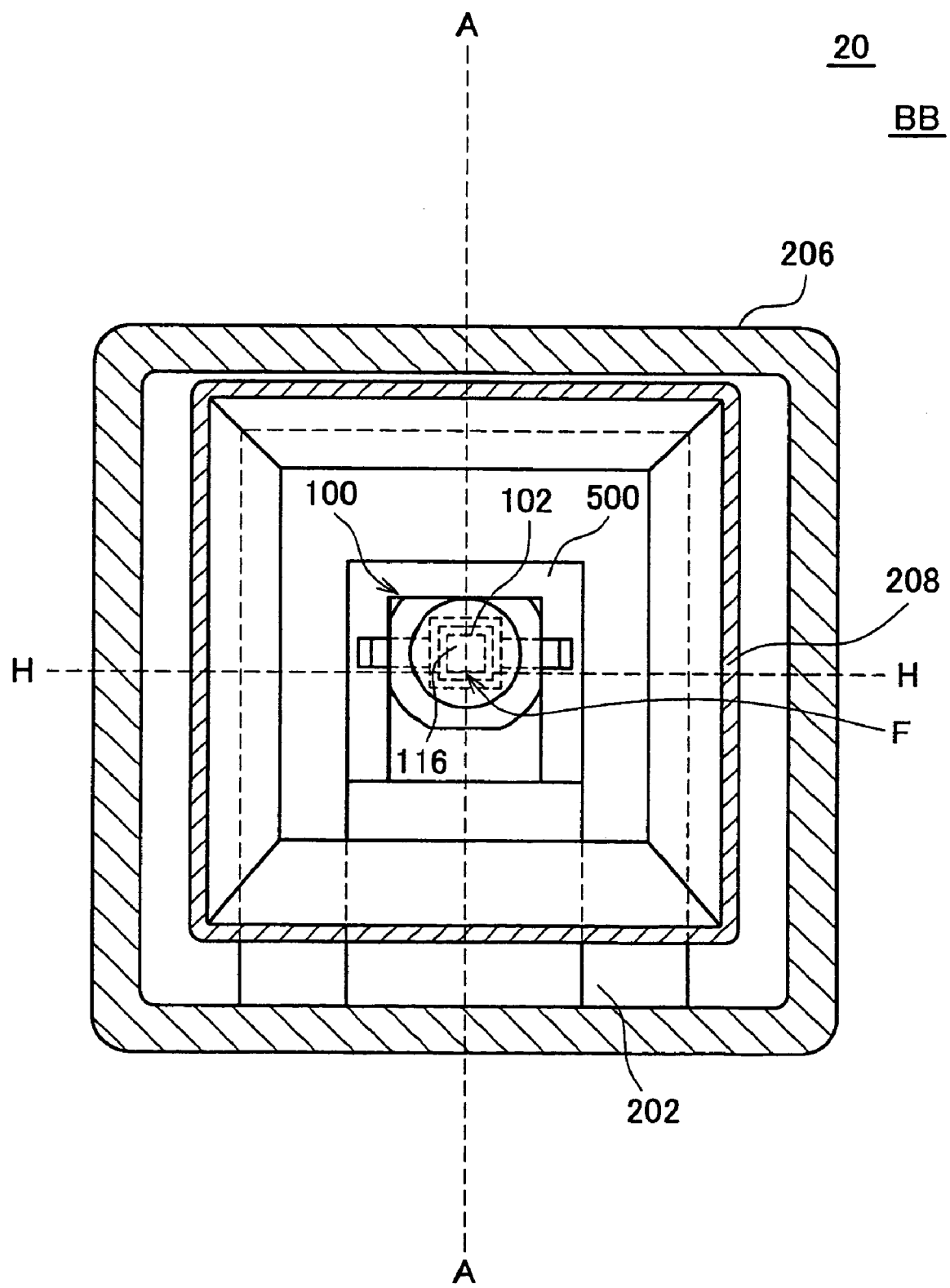
FIG. 8 is a vertical sectional view taken on line B-B of the light source unit.

FIGS. 7 and 8 are views exemplary showing a configuration of the light source unit 20. FIG. 7 is a vertical sectional view taken on line A-A of the light source unit 20. FIG. 8 is a vertical sectional view taken on line B-B of the light source unit 20. The light source unit 20 is a light source unit of a direct projection type that irradiates light emitted from the LED module 100 ahead of the vehicle, and includes the LED module 100, a substrate 500, a fixing member 202, a lens 204, an extension 208, and a housing 206.

The LED module 100 is fixed on the substrate 500 so that one side on the light-emitting face 116 of the light-emitting diode element 102 and an optical axis of the lens 204 are orthogonal. In addition, the light-emitting diode element 102 emits light from the light-emitting face 116 depending on electric power received from the outside of the light source unit 20 via the cable 22 and the substrate 500.

The substrate 500 electrically connects the LED module 100 and the cable 22 by printed wiring formed on its surface or in its inside. In this example, the substrate 500 is a plate-like body that puts the LED module 100 thereon to fix it, and fixes the LED module 100 at a predetermined reference position. At least a part of the substrate 500 is formed of materials such as metal having higher thermal conductivity than that of air. In addition, at least a part of the substrate 500 is in contact with the fixing member 202. In this way, the substrate 500 transmits heat generated from the LED module 100 to the fixing member 202.

The fixing member 202 is a plate-like body having a surface that faces toward, e.g., the front of the vehicle. The fixing member 202 is provided at a position capable of knowing a relative position to the lens 204. In addition, the fixing member 202 fixes the substrate 500 thereon so as to face the LED module 100 while putting the substrate 500 therebetween. In this way, the fixing member 202 fixes the LED module 100 to face toward the front of the vehicle, and thus the LED module emits light ahead of the vehicle.

In addition, the fixing member 202 is formed of materials such as metal having higher thermal conductivity than that of air. The fixing member 202 also comes in contact with the housing 206 at its one end. In this way, the fixing member 202 transmits heat generated from the LED module 100 to the housing 206 in order to radiate heat in the LED module 100. Therefore, it is possible to prevent a light-emitting amount of the LED module 100 from falling by heat.

The extension 208 is formed of, e.g., thin metal plate from the vicinity of the LED module 100 to the vicinity of an edge of the lens 204. In this way, the extension 208 covers a clearance between the inside of the housing 206 and the LED module 100 so as to improve an appearance of the vehicular lamp 10 (see FIG. 1). The extension 208 may reflect light emitted from the LED module 100.

The housing 206 is a casing that accommodates the LED module 100, the substrate 500, the fixing member 202, and the extension 208. In addition, the housing 206 has an opening section in its front face, and holds the lens 204 in the opening section. The housing 206 may further transmit heat received from the LED module 100 through the substrate 500 and the fixing member 202 to the heat dissipation member 24 (see FIG. 1) and/or the extension reflector 28 (see FIG. 1) Therefore, it is possible to adequately radiate heat in the LED module 100.

The lens 204 is an example of an optical member used for the vehicular lamp 10, and irradiates light emitted from the LED module 100 to the outside of the vehicular lamp 10. In this example, the lens 204 forms at least a part of the light distribution pattern by projecting a shape of the light-emitting face 116 of the light-emitting diode element 102 on the front of the vehicle. In addition, the lens 204 has a focal point F, which is an example of the optical center, on one side of the light-emitting face 116. In this case, the lens 204 forms at least a part of cut line that defines borders between bright and dark sides of the light distribution pattern, e.g., based on a shape of this straight line-shaped border. According to this example, it is possible to adequately form a light distribution pattern.

Here, in this example, the sub-wavelength grating 132 (see FIG. 3) is formed on the outgoing face 120 of the sealing member 108 (see FIG. 3). However, when the sealing member 108 on which the sub-wavelength grating 132 is formed is not used, the outgoing face 120 uses, e.g., the sealing member 108 of a spherical shape, and thus the light-emitting face 116 seen from the lens 204 is magnified by the lens-shaped sealing member 108. In this case, since the sealing member 108 closer to the light-emitting diode element 102 than the lens 204 should be formed with higher precision than, e.g., that of the lens 204 in order to form a light distribution pattern with high precision, a cost for manufacturing the LED module 100 can rise in some cases.

In addition, since a position adjustment of the LED module 100 should be performed in consideration of the size of the magnified image of the light-emitting diode element 102, the position adjustment cannot be performed with high precision in some cases.

However, according to this example, the sealing member 108 having the planar outgoing face 120 can be used by forming the sub-wavelength grating 132. For that purpose, according to this example, the vehicular lamp 10 having a light distribution pattern formed with high precision can be offered at low cost. In addition, the position adjustment of the LED module 100 is performed while observing the light-emitting diode element 102 of the real size that is not magnified. Therefore, the position of the LED module 100 in relation to the lens 204 can simply be adjusted with high accuracy.

Figure 9:
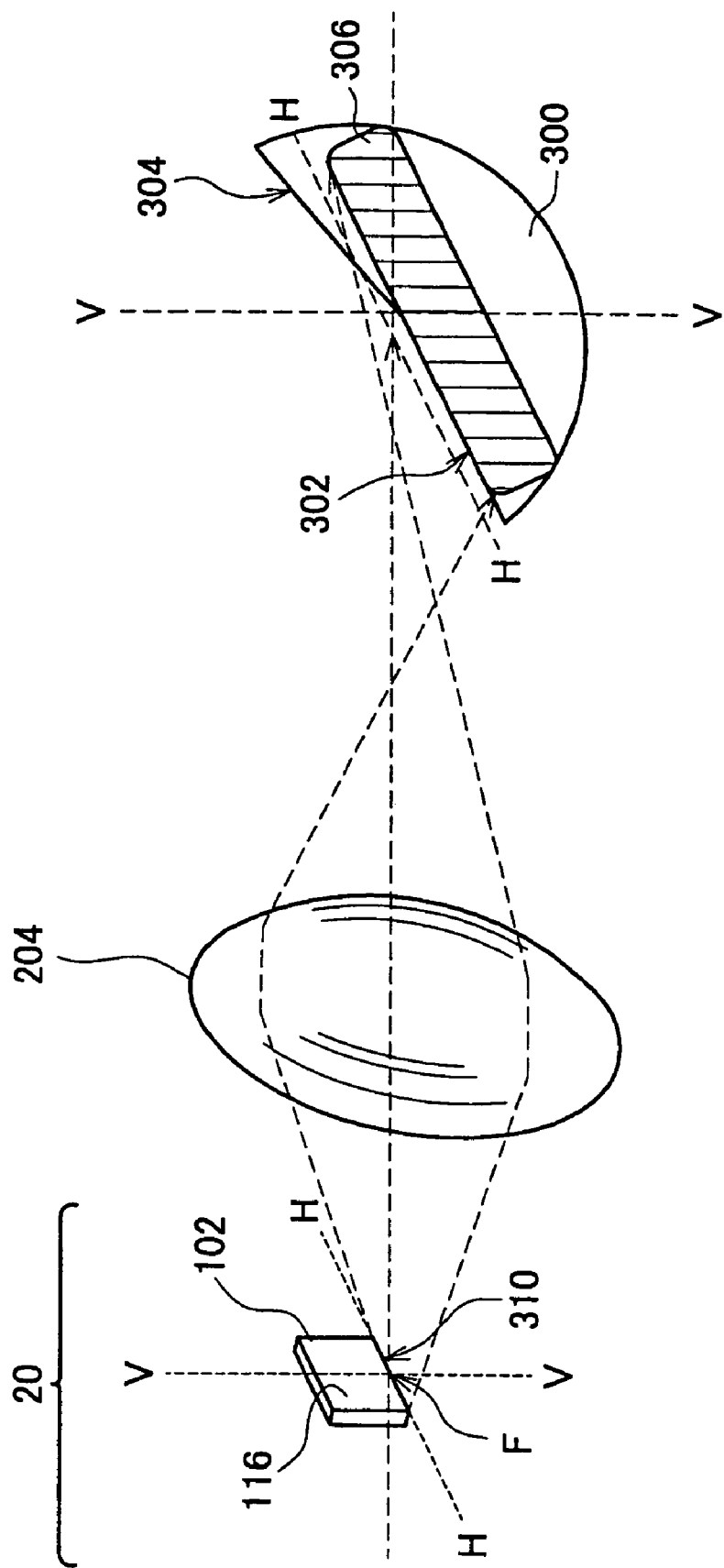
FIG. 9 is a conceptual view exemplary showing a light distribution pattern.

FIG. 9 is a conceptual view exemplary showing a light distribution pattern 300 formed by the vehicular lamp 10 (see FIG. 1). The light distribution pattern 300 is a low-beam light distribution pattern formed on a virtual vertical screen disposed on the position of 25 m in the front of the vehicular lamp 10. In this example, the vehicular lamp 10 forms the light distribution pattern 300 having a level cut line 302 that defines a border between bright and dark sides in the generally horizontal direction and an oblique cut line 304 that defines a border between bright and dark sides in the predetermined oblique direction forming an angle of about 15° to the horizontal direction.

In this example, the vehicular lamp 10 includes the plurality of light source units 20 having light distribution characteristics different from each other, and forms the light distribution pattern 300 based on light emitted from each of the light source units 20. In this case, each of the light source units 20 forms a portion of the light distribution pattern 300. For example, the light source unit 20 explained by FIGS. 7 and 8 forms some area 306 of the light distribution pattern 300.

Hereinafter, the light distribution characteristics of the light source unit 20 explained by FIGS. 7 and 8 will be described in more detail. In this example, the lens 204 of the light source unit 20 projects a shape of the light-emitting face 116 of the light-emitting diode element 102 ahead of the vehicle to form the area 306 by irradiating light emitted from the light-emitting diode element 102 forward. The lens 204 may magnify and project a shape of the light-emitting face 116 in the horizontal direction.

Here, in this example, the lens 204 has a focal point F on one side 310 of the light-emitting face 116. The side 310 is a lower side extended in the horizontal direction on the light-emitting face 116. In addition, the lens 204 crosses optical axes of the light source unit 20 to irradiate light emitted from the light-emitting diode element 102. Therefore, the lens 204 projects a shape of the side 310 of the light-emitting face 116 on an upper side position of the area 306.

In addition, the lens 204 forms at least a part of the upper side of the area 306 on the position where at least a part of the level cut line 302 should be formed. In this way, the light source unit 20 forms at least a part of the level cut line 302 based on a border between bright and dark sides formed by the area 306. According to this example, the light distribution pattern can be formed adequately.

Figure 10:
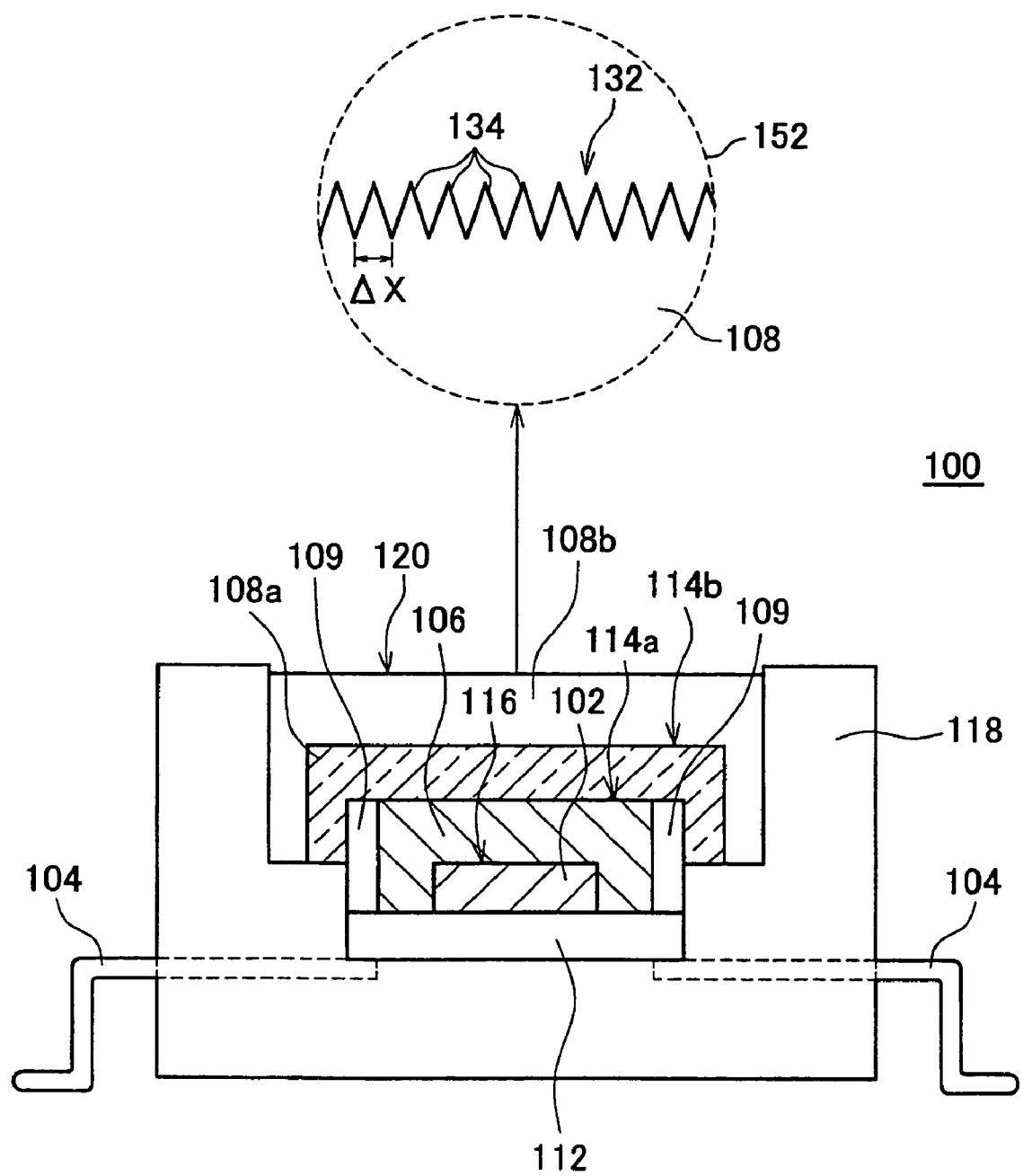
FIG. 10 is a view showing another example of a configuration of the LED module.

FIG. 10 is a view showing another example of a configuration of the LED module 100. Here, the explanation of the configuration of FIG. 10 having the same reference number as FIGS. 3 and 4 will be omitted except the components that are below explained because the configuration of the same reference number has the same function.

In this example, the LED module 100 has a plurality of sealing members 108a and 108b. The sealing member 108a faces the light-emitting diode element 102 to put the phosphor layer 106 therebetween, and is provided on the phosphor layer 106 so as to be in contact with the phosphor layer 106 on its interface 114a. It is preferable that the sealing member 108a is a fluid such as, e.g., silicone gel. In this case, stress caused by the sealing members 108a and 108b that is given to the light-emitting diode element 102 and the phosphor layer 106 can be reduced.

The sealing member 108b is provided on the sealing member 108a so as to face the phosphor layer 106 and the light-emitting diode element 102 to put the sealing member 108a therebetween. The sealing member 108b is formed of solid resin, and is in contact with the sealing member 108a on its interface 114b. In addition, the sealing member 108b has the outgoing face 120 on which the sub-wavelength grating 132 is formed, and emits light, which is incident from the light-emitting diode element 102 and the phosphor layer 106 via the sealing member 108a, to the outside of the LED module 100 through the outgoing face 120. In this example, it is possible to efficiently emit light from the sealing members 108a and 108b to an air medium. In this way, it is possible to provide the LED module 100 having high light-emitting efficiency.

In addition, the sealing member 108b may have a refractive index higher than that of the sealing member 108a. In this case, it is possible that light can efficiently be incident from the sealing member 108a to the sealing member 108b. In addition, the sealing member 108b may further have a sub-wavelength grating, e.g., on the interface 114b.

Figure 11:
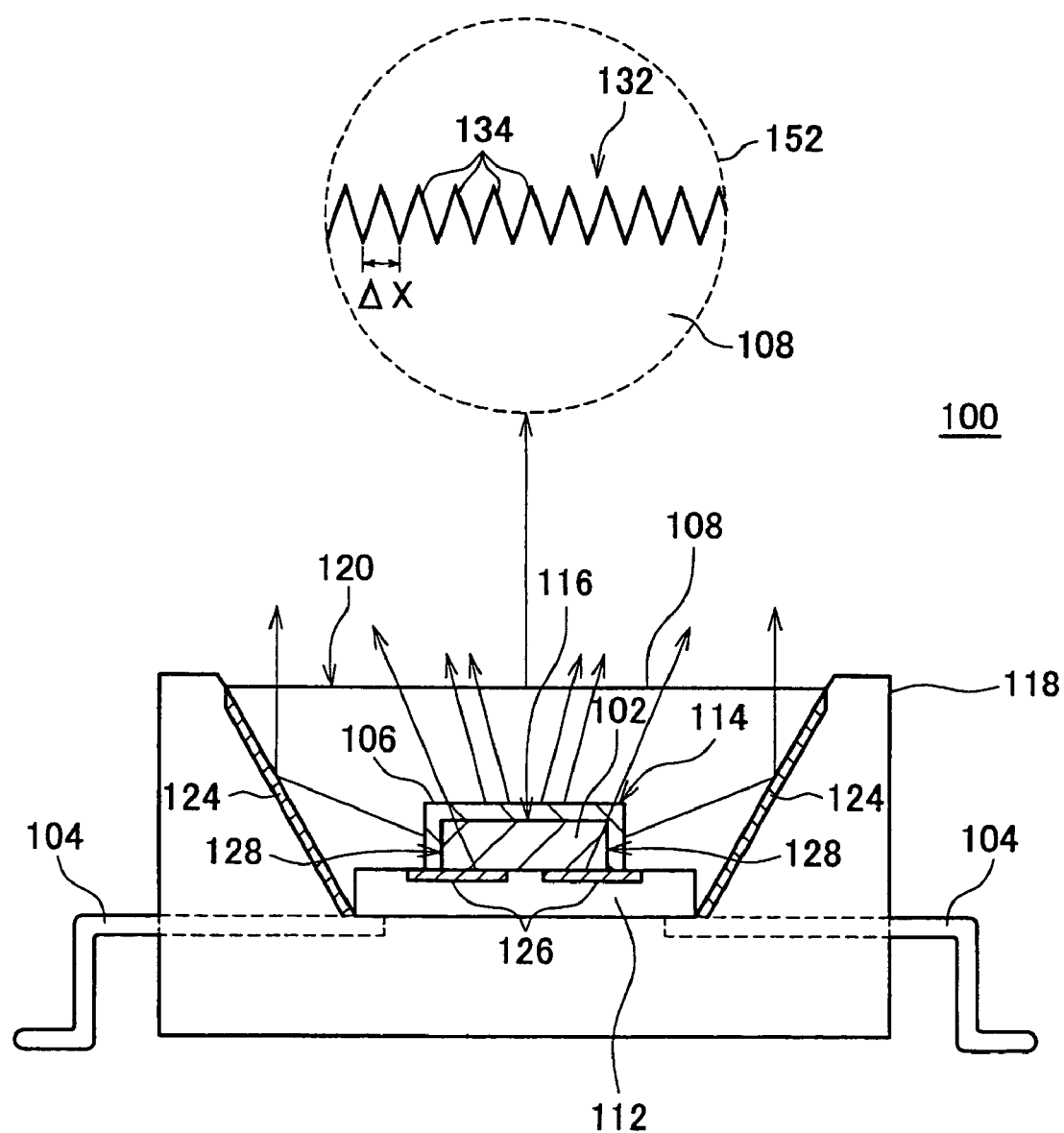
FIG. 11 is a view showing further another example of a configuration of the LED module.

FIG. 11 is a view showing further another example of a configuration of the LED module 100. Here, the explanation of the configuration of FIG. 11 having the same reference number as FIGS. 3 and 4 will be omitted except the components that are below explained because the configuration of the same reference number has the same function. In this example, the light-emitting diode element 102 further emits light from a rear face of the light-emitting face 116 and end faces 128 perpendicular to the light-emitting face 116. The phosphor layer 106 is applied on a thin film on the light-emitting diode element 102. In addition, the sealing member 108 is formed in the shape of frustum in which the outgoing face 120 acts as a bottom face. In this case, in regard to a cross-section perpendicular to the direction going from the outgoing face 120 to the light-emitting diode element 102, a cross-section area of the sealing member 108 gradually decreases along this direction.

In addition, in this example, the sub-wavelength grating 132 is not formed on side faces of the sealing member 108. In this case, the side faces of the sealing member 108 totally reflect at least a part of light emitted from the light-emitting diode element 102. In this way, a reflecting section 124 is formed on the side faces of the sealing member 108. The reflecting section 124 reflects at least a part of light emitted from the end faces 128 of the light-emitting diode element 102 toward the outgoing face 120 of the sealing member 108. In this case, the outgoing face 120 on which the sub-wavelength grating 132 is formed emits the light reflected by the reflecting section 124 to the outside of the LED module 100 with high efficiency. Therefore, according to this example, it is possible to efficiently utilize light emitted from the light-emitting diode element 102 by forming the sub-wavelength grating 132 on a part of the surface of the sealing member 108.

In addition, the LED module 100 further includes a reflecting section 126 on the substrate 112. The reflecting section 126 is, e.g., a metal layer formed on the substrate 112. The reflecting section 126 reflects light emitted from the rear face of the light-emitting diode element 102 toward the outgoing face 120 of the sealing member 108. In this way, it is possible to utilize light emitted from the light-emitting diode element 102 more efficiently.

Figure 12:
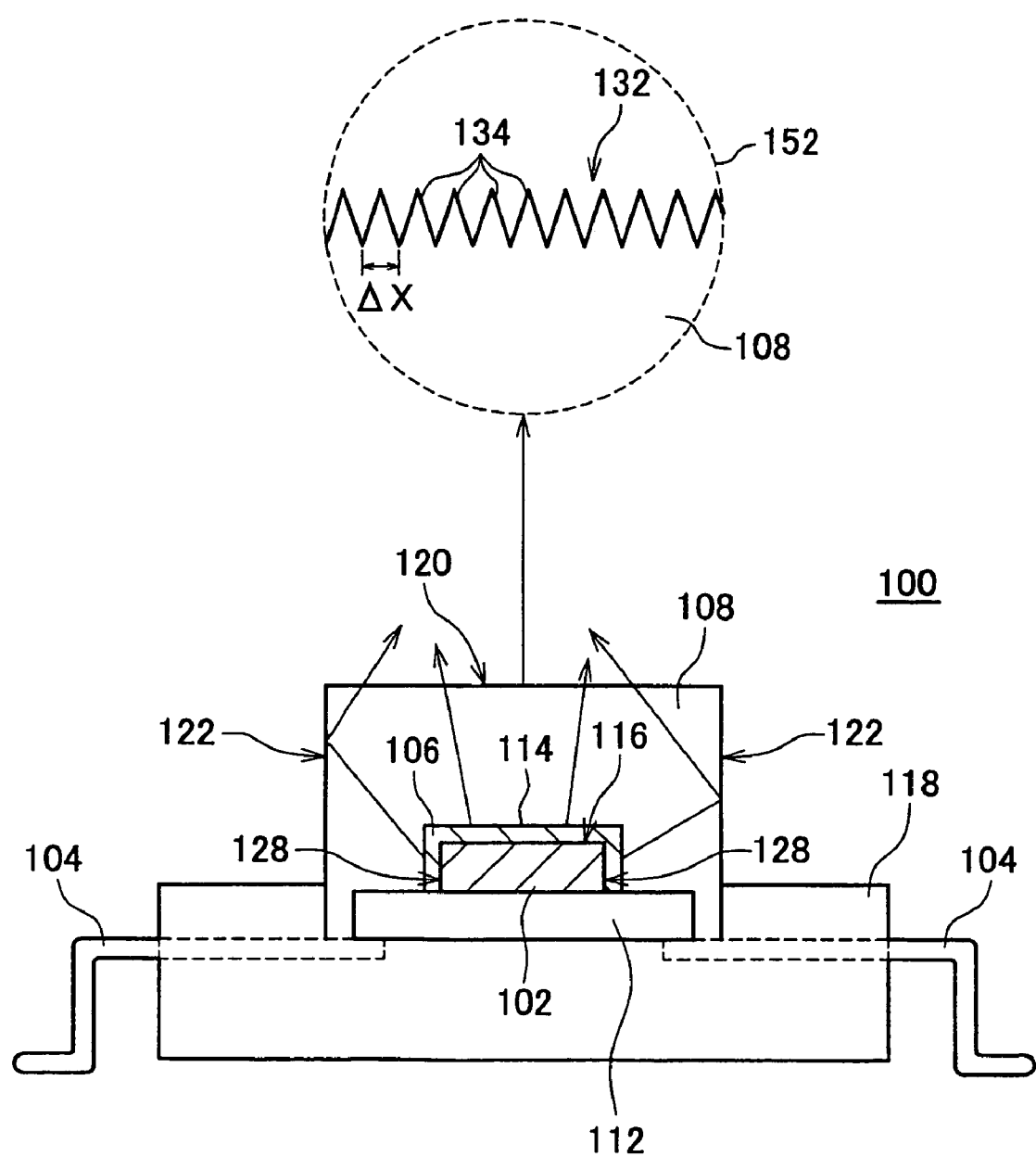
FIG. 12 is a view showing further another example of a configuration of the LED module.

FIG. 12 is a view showing further another example of a configuration of the LED module 100. Here, the explanation of the configuration of FIG. 12 having the same reference number as FIGS. 3 and 4 will be omitted except the components that are below explained because the configuration of the same reference number has the same function. In this example, the light-emitting diode element 102 further emits light from the end faces 128 perpendicular to the light-emitting face 116. In addition, the sealing member 108 is formed to cover the light-emitting face 116 and the end faces 128 of the light-emitting diode element 102. In this case, the sealing member 108 covers the end faces 128 using side faces 122 facing the end faces 128.

In addition, the sub-wavelength grating 132 is not formed on the side faces 122 of the sealing member 108. Therefore, the side faces 122 totally reflect at least a part of light emitted from the light-emitting diode element 102. In this way, the sealing member 108 reflects light emitted from the end faces 128 of the light-emitting diode element 102 toward the outgoing face 120 of the sealing member 108 using its side faces 122. In this case, the outgoing face 120 on which the sub-wavelength grating 132 is formed emits the light reflected by the side faces 122 to the outside of the LED module 100 with high efficiency. Therefore, according to this example, it is possible to efficiently utilize light emitted from the light-emitting diode element 102 by forming the sub-wavelength grating 132 on a part of the surface of the sealing member 108.

Figure 13:
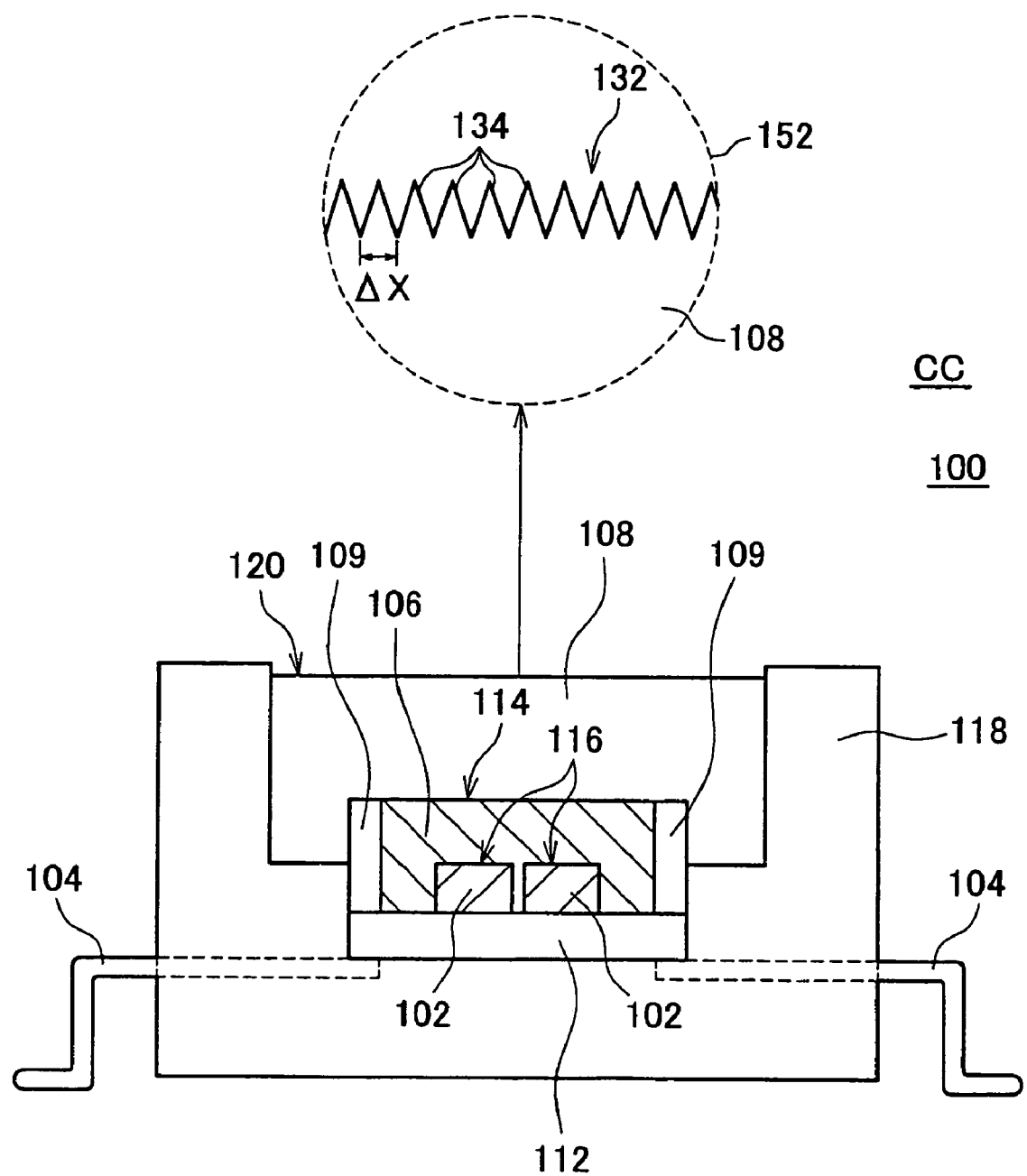
FIG. 13 is a view showing further another example of a configuration of the LED module.

FIG. 13 is a view showing further another example of a configuration of the LED module 100. Here, the explanation of the configuration of FIG. 13 having the same reference number as FIGS. 3 and 4 will be omitted except the components that are below explained because the configuration of the same reference number has the same function. In this example, the LED module 100 includes a plurality of light-emitting diode elements 102. The phosphor layer 106 is provided to cover the plurality of light-emitting diode elements 102. The sealing member 108 seals the plurality of light-emitting diode elements 102 and the phosphor layer 106. In this case, the sub-wavelength grating 132 reduces the reflection of light emitted from each of the light-emitting diode elements 102. Therefore, according to this example, it is possible to efficiently utilize light emitted from the light-emitting diode elements 102.

Figure 14:
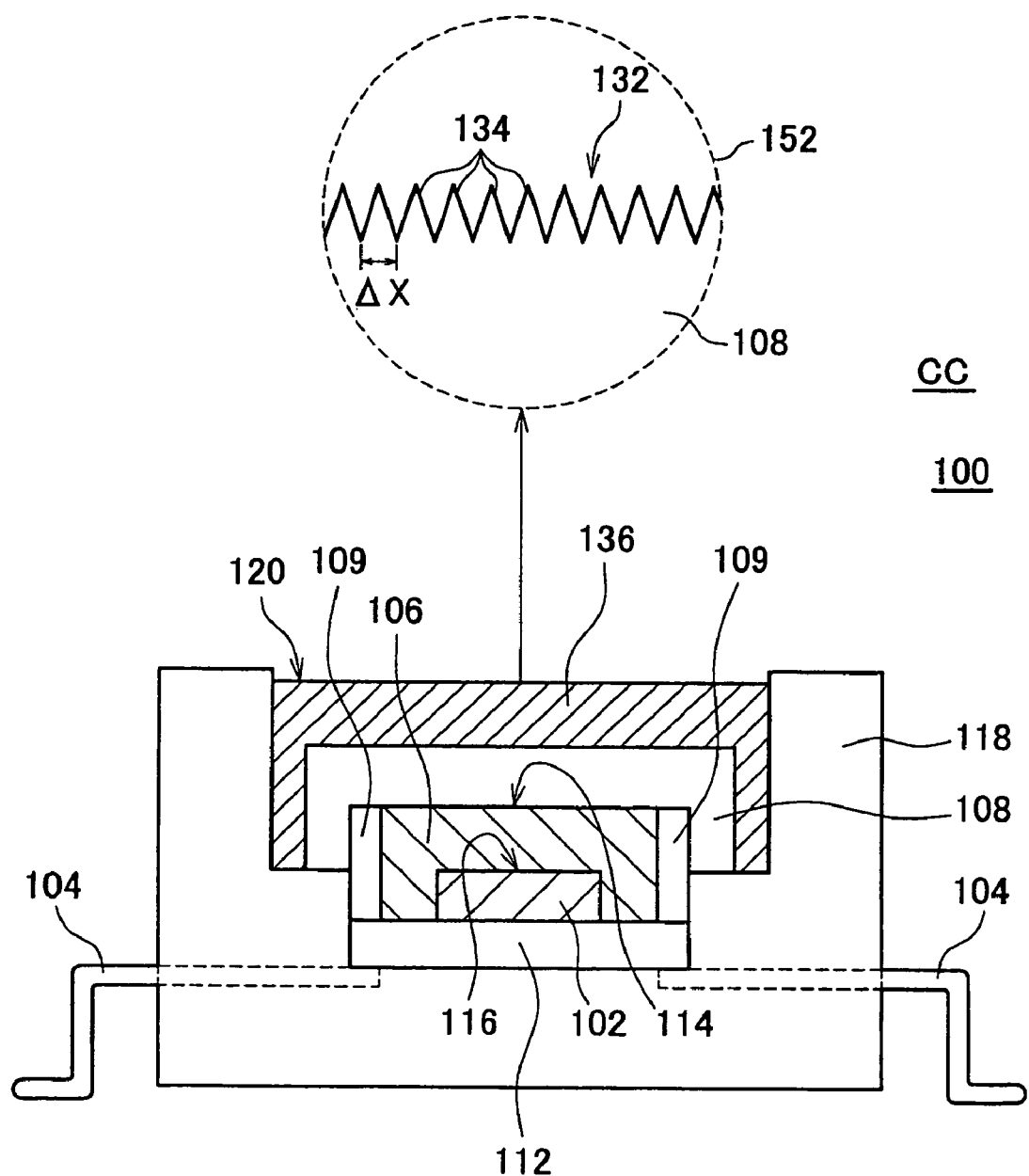
FIG. 14 is a view showing further another example of a configuration of the LED module.

FIG. 14 is a view showing further another example of a configuration of the LED module 100. Here, the explanation of the configuration of FIG. 14 having the same reference number as FIGS. 3 and 4 will be omitted except the components that are below explained because the configuration of the same reference number has the same function. In this example, the LED module 100 further includes a lens 136. The lens 136 is another example of a light transmission member, and is provided on the sealing member 108 so as to face the light-emitting diode element 102 while putting the sealing member 108 therebetween.

The lens 136 is, e.g., a lens of a planar shape, and has the sub-wavelength grating 132 on the outgoing face 120 parallel to the light-emitting face 116 of the light-emitting diode element 102. In this way, the lens 136 emits light, which is incident from the light-emitting diode element 102 via the sealing member 108, from the outgoing face 120 to an air medium with high efficiency. Therefore, according to this example, it is possible to efficiently utilize light emitted from the light-emitting diode elements 102.

In addition, the lens 136 is formed of, e.g., thermoplastic rein using injection molding separately from the sealing member 108. In this case, it is possible to form the sub-wavelength grating 132 at low cost by forming a shape of the sub-wavelength grating 132 on a metal mold.

Here, the lens 136 may have a refractive index of, e.g., about 1.5 to 1.6 higher than that of the sealing member 108. In this case, light from the sealing member 108 can be incident on the lens 136 with high efficiency. Therefore, it is possible to utilize light emitted from the light-emitting diode elements 102 more efficiently.

In addition, the lens 136 may have a refractive index between the sealing member 108 and air. In this case, since a refractive index of each element gradually becomes small in an optical path from the light-emitting diode element 102 to an air medium via the sealing member 108 and the lens 136, a sudden change of the refractive index does not occur. Therefore, it is possible to efficiently transmit light emitted from the light-emitting diode element 102 to an air medium.

In addition, in another example, the phosphor layer 106 may be provided, e.g., between the sealing member 108 and the lens 136. In this case, the lens 136 is used as a second sealing member, and seals the phosphor layer 106.

Figure 15:
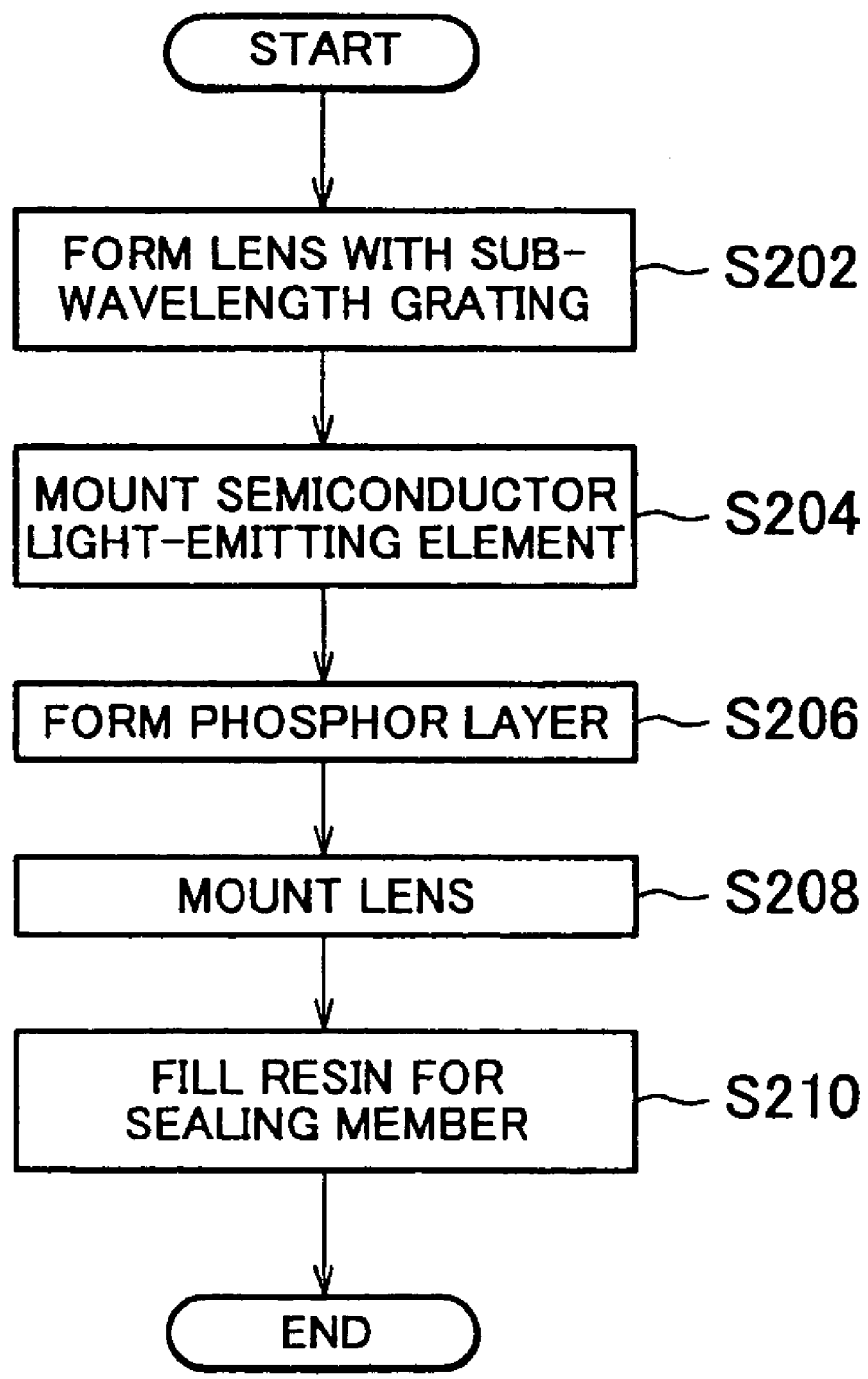
FIG. 15 is a flowchart exemplary showing a method for manufacturing the LED module.

FIG. 15 is a flowchart exemplary showing a method for manufacturing the LED module 100 explained with reference to FIG. 14. In this manufacturing method, the lens 136 with the sub-wavelength grating is firstly formed by injection molding (S202). Similarly to, e.g., the steps S104 and S106 explained with reference to FIG. 6, the light-emitting diode element 102 is mounted (S202) and the phosphor layer 106 is formed (S206).

Then, the lens 136 is mounted to cover the light-emitting diode element 102 (S208), and resin for the sealing member 108 is filled in a clearance between the light-emitting diode element 102 and the phosphor layer 106 and the lens 136 (S210). In this way, the sealing member 108 is formed. In addition, in this case, the resin for the sealing member 108 may be cured by irradiating ultraviolet rays, e.g., over the lens 136. According to this example, it is possible to simply form the sub-wavelength grating 132 on the lens 136 at low cost. Therefore, it is possible to provide the LED module 100 having high light-emitting efficiency at low cost.

In addition, in the S210, the resin for the sealing member 108 may be filled through a hole that is previously provided in, e.g., the lens 136 or the holding section 118. In addition, in another example, the lens 136 may be mounted after the resin for the sealing member 108 is filled on the phosphor layer 106. Further, in another example, a part of lens 136 may be formed by injection molding. In this case, it is preferable that at least the sub-wavelength grating 132 of the lens 136 is formed by injection molding. In this case, the sub-wavelength grating 132 can also be formed simply and at low cost.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A light-emitting module that emits light, comprising:
a semiconductor light-emitting element that emits light; and
a light transmission member that is provided to cover said semiconductor light-emitting element with materials for transmitting the light emitted from said semiconductor light-emitting element and forms a sub-wavelength grating for reducing reflection of the light on its outgoing face for sending the light incident from an interface facing said semiconductor light-emitting element to its outside in grid periods shorter than a wavelength of the light transmitted by said light transmission member;
wherein the sub-wavelength grating has a plurality of convex portions protruding in a direction perpendicular to the outgoing face,
the plurality of convex portions is arranged at grating intervals shorter than half-wavelength of the light to be transmitted through said light transmission member, and
a height of the convex portion is higher than half-wavelength of the light to be transmitted through said light transmission member.

2. A light-emitting module as claimed in claim 1, wherein said light transmission member is formed of resin.

3. A light-emitting module as claimed in claim 1, wherein said light transmission member is a sealing member for sealing said semiconductor light-emitting element.

4. A light-emitting module as claimed in claim 1, wherein
said semiconductor light-emitting element emits ultraviolet rays,
said light-emitting module further comprises a phosphor layer for generating red light, green light, and blue light in accordance with the ultraviolet rays emitted from said semiconductor light-emitting element,
said light transmission member transmits red light, green light, and blue light generated from said phosphor layer to send the light from the outgoing face to an air medium,
the plurality of convex portions is arranged at grating intervals shorter than half-wavelength of the blue light transmitting said light transmission member, and
a height of the convex portion is higher than half-wavelength of the red light transmitting an air medium.

5. A light-emitting module as claimed in claim 1, wherein
said semiconductor light-emitting element emits blue light,
said light-emitting module further comprises a phosphor layer for generating yellow light in accordance with the blue light emitted from said semiconductor light-emitting element,
said light transmission member transmits blue light and yellow light generated from said semiconductor light-emitting element and said phosphor layer to send the light from the outgoing face to an air medium,
the plurality of convex portions is arranged at grating intervals shorter than half-wavelength of the blue light transmitting said light transmission member, and
a height of the convex portion is higher than half-wavelength of the yellow light transmitting an air medium.

6. A light-emitting module as claimed in claim 1, wherein said semiconductor light-emitting element emits light from a light-emitting face facing the outgoing face, and
the outgoing face of said light transmission member is parallel to the light-emitting face of said semiconductor light-emitting element.

7. A light-emitting module as claimed in claim 1, wherein a refractive index of said light transmission member is larger than that of the outside of said light transmission member on the outgoing face and smaller than that of the outside of said light transmission member on the interface facing said semiconductor light-emitting element, and
- a refractive index difference between the inside and the outside of said light transmission member on the outgoing face is larger than that between the inside and the outside of said light transmission member on the interface facing said semiconductor light-emitting element.

8. A light-emitting module as claimed in claim 1, wherein a refractive index of said light transmission member is larger than that of either the outside of said light transmission member on the outgoing face or the outside of said light transmission member on the interface facing said semiconductor light-emitting element.

9. A light-emitting module as claimed claim 1, wherein
- said semiconductor light-emitting element emits light from a light-emitting face facing the outgoing face and an end face perpendicular to the light-emitting face,
- said light transmission member is formed to cover the light-emitting face and the end face of said semiconductor light-emitting element, and
- said light transmission member reflects light emitted from the end face by said semiconductor light-emitting element toward the outgoing face of said light transmission member using a side face facing the end face of said semiconductor light-emitting element.

10. A light-emitting module as claimed in claim 1, wherein
- said semiconductor light-emitting element emits light from a light-emitting face facing the outgoing face, a rear face of the light-emitting face, and/or an end face perpendicular to the light-emitting face, and
- said light-emitting module further comprises a reflecting section for reflecting light emitted from the rear face and the end face by said semiconductor light-emitting element toward the outgoing face of said light transmission member.

11. A lamp that emits light, comprising:
a light-emitting module as claimed in claim 1; and
an optical member operable to irradiate light emitted from said light-emitting module to the outside of the lamp,
wherein said optical member has an optical center on said semiconductor light-emitting element.

12. A lamp as claimed in claim 11, wherein
said lamp is a lamp used for a headlight of a vehicle,
said semiconductor light-emitting element emits light from a light-emitting face facing the outgoing face of said light transmission member,
the outgoing face of said light transmission member is parallel to the light-emitting face of said semiconductor light-emitting element, and
said optical member forms at least a part of cutline that defines borders between bright and dark sides of a light distribution pattern of the headlight by projecting a shape of the light-emitting face of said semiconductor light-emitting element.

* * * * *